United States Patent
Ozawa et al.

(10) Patent No.: US 7,148,158 B2
(45) Date of Patent: Dec. 12, 2006

(54) SEMICONDUCTOR DEVICE AND METHOD FOR MANUFACTURING THE SAME

(75) Inventors: Yoshio Ozawa, Yokohama (JP); Masayuki Tanaka, Yokohama (JP); Kiyotaka Miyano, Fujisawa (JP); Shigehiko Saida, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 155 days.

(21) Appl. No.: 10/916,500

(22) Filed: Aug. 12, 2004

(65) Prior Publication Data

US 2005/0014354 A1   Jan. 20, 2005

Related U.S. Application Data

(62) Division of application No. 10/337,978, filed on Jan. 8, 2003, now abandoned.

(30) Foreign Application Priority Data

Jan. 10, 2002   (JP) .............................. 2002-003192

(51) Int. Cl.
  *H01L 21/338*   (2006.01)
  *H01L 21/8238*   (2006.01)
  *H01L 21/336*   (2006.01)
  *H01L 21/4763*   (2006.01)
  *H01L 21/44*   (2006.01)

(52) U.S. Cl. .............. 438/787; 438/184; 438/185; 438/230; 438/231; 438/285; 438/303; 438/431; 438/635; 438/743; 438/757

(58) Field of Classification Search .............. None
  See application file for complete search history.

(56) References Cited

U.S. PATENT DOCUMENTS 4,810,673 A    3/1989  Freeman
5,225,355 A    7/1993  Sugino et al.
5,408,115 A *  4/1995  Chang ................... 257/324
5,599,726 A    2/1997  Pan
5,937,319 A    8/1999  Xiang et al.
6,190,977 B1   2/2001  Wu
6,232,641 B1   5/2001  Miyano et al.
6,288,433 B1   9/2001  Akram et al.
6,333,547 B1  12/2001  Tanaka et al.
6,593,196 B1   7/2003  Akram et al.
6,635,938 B1* 10/2003  Nakahata et al. ........ 257/382
6,790,723 B1*  9/2004  Tanaka et al. ........... 438/243

(Continued)

FOREIGN PATENT DOCUMENTS

JP     8-46187    2/1996

(Continued)

OTHER PUBLICATIONS

Tanaka, M. et al., "Semiconductor Device And Method Of Manufacturing The Same," U.S. Appl. No. 09/984,404, filed Oct. 30, 2001.

(Continued)

*Primary Examiner*—Carl Whitehead, Jr.
*Assistant Examiner*—James M. Mitchell
(74) *Attorney, Agent, or Firm*—Finnegan, Henderson, Farabow, Garrett & Dunner, L.L.P.

(57) ABSTRACT

A semiconductor device includes a semiconductor device comprising a semiconductor substrate, source/drain regions formed in the semiconductor substrate, a gate insulation film formed on the semiconductor substrate, a gate electrode formed on the gate insulation film between the source/drain regions, and a gate sidewall spacer formed on side surfaces of the gate electrode, wherein the gate sidewall spacer is composed of silicon oxide containing 0.1–30 atomic % of chlorine.

15 Claims, 8 Drawing Sheets

U.S. PATENT DOCUMENTS

2002/0024119 A1* 2/2002 Tanaka et al. ............... 257/649
2003/0017689 A1* 1/2003 Akram et al. ................ 438/595

FOREIGN PATENT DOCUMENTS

| JP | 10-340900 | 12/1998 |
| JP | 2000-049348 | 2/2000 |
| JP | 2000-323474 | 11/2000 |
| JP | 2001-168092 | 6/2001 |
| JP | 2001-257346 | 9/2001 |
| JP | 2001-274246 | 10/2001 |
| WO | WO 99/31732 | 6/1999 |
| WO | 2002-509361 | 3/2002 |

OTHER PUBLICATIONS

Wolf, et al. Silicon Processing for the VLSI Era, vol. 2-Process Integration, Lattice Press: Sunset Beach CA, 1990, pp. 154-158.
Japanese Patent Office Notification of Reasons for Rejection in Application No. 2002-003192 and English translation thereof.

* cited by examiner

SEMICONDUCTOR DEVICE AND METHOD FOR MANUFACTURING THE SAME

CROSS-REFERENCE TO RELATED APPLICATIONS

This is a divisional of application Ser. No. 10/337,978, filed Jan. 8, 2003 now abandoned, upon which this application claims the benefits provided in 35 U.S.C. §120.

This-application is based upon and claims the benefit of priority from the prior Japanese Patent Application No. 2002-003192, filed Jan. 10, 2002; the entire contents of which are incorporated herein by reference.

BACKGROUND OF THE INVENTION

1. Field of the Invention

The present invention relates to a MOS transistor having an improved sidewall of a gate electrode and a method for manufacturing the same.

2. Description of the Related Art

As a structure of a semiconductor device is patterned finer, parasitic capacitance which is inevitably present in an element structure gives rise to a larger problem. For example, the parasitic capacitance, which occurs between a gate electrode and a source/drain region which provides a MOS transistor, reduces an operating speed of the transistor and has a larger effect as the elements are patterned finer.

FIG. 7A shows part of a gate electrode structure of a conventional MOS transistor. Provided on a semiconductor substrate 111 such as silicon is a gate insulation film 112 such as a silicon oxide film, on which a gate electrode 113 is formed. A source/drain region 116 is formed in the semiconductor substrate 111. Side and upper surfaces of the gate electrode 113 are covered with a gate protecting insulation film (Sidewall Oxide Layer) 114, and the side surface of the protecting insulation film 114 is covered with a gate sidewall insulation film (Sidewall Spacer) 115 such as a silicon nitride film.

In the MOS transistor having such a configuration, the gate protection film 114 and the gate sidewall insulation film 115 are interposed as a dielectric between the gate electrode 113 and the source/drain diffusion region 116 (including a wiring layer thereof), so that there occurs unwanted parasitic capacitance.

Parasitic capacitance reduces the operating speed of the transistor. Especially in a fine-patterned transistor having a gate length of 0.2 µm or less, the parasitic capacitance reduces the operating speed greatly.

Furthermore, a MOS transistor having an elevated source/drain configuration shown in FIG. 7B has an elevated source/drain layer 117 which overlies the source/drain region 116 and is in contact with the gate sidewall spacer 115. This MOS transistor similarly suffers from drastic reduction in operating speed owing to large parasitic capacitance between the gate electrode 113 and the elevated source/drain layer 117 (including the wiring layer thereof) where the gate protection film 114 and the gate sidewall spacer 115 are interposed therebetween.

Although silicon oxide has been used as a material of the gate sidewall spacer conventionally, silicon nitride with high dielectric constant is used recently for a later-described reason. This has made the problem of parasitic capacitance further serious.

FIGS. 8A–8D and FIGS. 9A–9C show a method for manufacturing a MOS transistor in a case where a conventional gate sidewall spacer is made of silicon oxide.

As shown in FIG. 8A, after a gate oxide film 122 is formed on a silicon semiconductor substrate 121, a polysilicon film is deposited by Chemical Vapor Deposition (CVD) and processed by Reactive Ion Etching (RIE) to form a gate electrode 123 thereof.

As shown in FIG. 8B, an exposed surface of the gate electrode 123 is oxidized to form a gate protecting insulation film 124. Then, a part 125 of a source/drain diffusion region is formed in the semiconductor substrate 121 by ion implantation.

As shown in FIG. 8C, a silicon oxide film is deposited by CVD over the substrate surface and then removed by RIE to form a gate sidewall spacer 126 thereof. In this case, the exposed surface of the semiconductor substrate 121 is damaged by ions, so that a roughened exposed surface is formed on the one part 125 of the source/drain region.

As shown in FIG. 8D, a source/drain diffusion region 127 is formed in the semiconductor substrate 121 by ion implantation. In this case, since the surface of the semiconductor substrate 121 is roughened, variation in the shape of the diffusion regions occurs among the elements, which results in increased fluctuations in operating characteristics thereof.

As shown in FIG. 9A, the oxide film is removed from the upper surface of the gate electrode 123 using dilute hydrofluoric acid. In this case, the gate protection film 124 and the gate sidewall insulation film 126 are also removed partially. There are some cases where the insulation film 126 of the sidewall spacer is left little by a type of the MOS transistor formed on the semiconductor substrate 121. Next, as shown in FIG. 9B, a cobalt layer 128 is deposited over the substrate surface by sputtering.

As shown in FIG. 9C, a cobalt silicide layer 129 is provided on the gate electrode 123 and the source/drain region 127 by lamp heating. Thereafter, a non-reacted the cobalt layer is removed. In this case, in the MOS transistor in which the insulation film of the gate sidewall spacer is not almost left, the gate electrode 123 and the source/drain region 127 are electrically connected through the cobalt silicide layer 129, thereby reducing the yield.

To eliminate such a problem in this case of using the silicon oxide as the gate sidewall spacer, a silicon nitride film has been used as the gate sidewall spacer as shown in FIGS. 10A–10D and FIGS. 11A–11C.

After a gate oxide film 132 is formed on a semiconductor substrate 131 such as silicon, a gate electrode 133 such as a polysilicon film is formed thereon (FIG. 10A). Next, an exposed surface of the gate electrode. 133 is oxidized to form a gate protection insulation film 134. Then, a part 135 of a source/drain diffusion region is formed in the semiconductor substrate 131 by ion implantation (FIG. 10B). A silicon nitride film is deposited over the substrate surface by CVD and then selectively removed by RIE to provide a gate sidewall insulation spacer 136 on a side surface of the gate protection film 134.

According to the method, as shown in FIG. 11C, since the exposed face of the semiconductor substrate 131 can be prevented from being roughened, the shape of the source/drain diffusion region 137 does not vary among elements as shown in FIG. 10D. Therefore, it is possible to reduce fluctuations in operating characteristics of the elements.

Furthermore, as shown in FIG. 11A, the gate sidewall spacer is not removed during processing by use of dilute hydrofluoric acid, so that as shown in FIG. 11C the gate electrode 133 and the source/drain region 137 are not electrically connected, thereby preventing the yield from being deteriorated.

According to this method, however, since the dielectric constant of the gate sidewall spacer is about twice as large as that of the conventional silicon oxide film, the parasitic capacitance is roughly doubled, thus greatly reducing the operating speed of the element.

In this MOS transistor, a cobalt layer 138 is deposited over the surface of the semiconductor substrate 131 by sputtering (FIG. 11B). Then, using the lamp heating, a cobalt silicide layer 139 is formed on the gate electrode 133 and the source/drain region 137 (FIG. 11C) A non-reacted cobalt layer is removed.

The above-mentioned problem occurs also in a case of forming a MOS transistor having an elevated source/drain structure shown in FIGS. 12A–12D.

That is, FIGS. 12A–12D show a method for manufacturing a MOS transistor in a case of forming the gate sidewall spacer using the silicon oxide.

As shown in FIG. 12A, after a gate oxide film 142 is formed on a semiconductor substrate 141 such as silicon, a polysilicon film and a silicon nitride film are deposited consecutively by CVD and processed by RIE to form a gate electrode 143 and a silicon nitride film 144 sequentially.

As shown in FIG. 12B, after an exposed surface of the gate electrode 143 is oxidized to form a gate protection film 145, a part 146 of a source/drain diffusion region is formed in the silicon substrate by ion implantation.

As shown in FIG. 12C, a silicon oxide film is deposited over the surface of the semiconductor substrate 141 by CVD and then removed by RIE to form a gate sidewall spacer 147. In this case, the silicon semiconductor substrate is exposed partially and subjected to impact by ions, thereby providing a roughened surface thereon.

As shown in FIG. 12D, an elevated source/drain layer 148 is formed by epitaxial growth of silicon. In this case, a gap 150 called a facet is formed between the gate sidewall spacer 147 and the elevated layer 148.

A source/drain diffusion region 149 is formed in the semiconductor substrate 141 by ion implantation. In this case, a diffusion region under the facet is formed deep, so that it is difficult to control a threshold value of the transistor owing to the short-channel effect.

Therefore, a manufacturing method using a silicon nitride film is used as shown in FIGS. 13A–13D.

That is, as shown in FIG. 13A, after a gate oxide film 152 is formed on a semiconductor substrate 151 such as silicon, a polysilicon film and a silicon nitride film are deposited consecutively by CVD and processed by RIE to provide a gate electrode 153 and a silicon nitride film 154 sequentially.

As shown in FIG. 13B, after an exposed surface of the gate electrode 153 is oxidized to form a gate protection film 155, a part 156 of a source/drain diffusion region is formed in the silicon substrate 151 by ion implantation.

As shown in FIG. 13C, a silicon nitride film is deposited over the surface of the semiconductor substrate 151 by CVD and then removed from the flat portion by RIE to form a gate sidewall spacer 157.

According to the method, the surface of the semiconductor substrate in which the diffusion layer is formed is not roughened and, in addition, a gap called a facet is not formed between the gate sidewall spacer 157 and the elevated layer 158 as shown in FIG. 13D.

Therefore, the source/drain diffusion region is formed just as designed, so that the threshold value of the transistors can be controlled easily.

According to this method, however, the dielectric constant of the gate sidewall spacer is about twice as large as that of a conventional silicon oxide film, so that the parasitic capacitance is also doubled approximately, thus greatly reducing the operating speed of the elements.

As described above, to suppress variations in shape of the source/drain diffusion region thereby to prevent an undesired failure of short-circuiting at the time of salicide formation, a silicon nitride film is used as at least part of the gate sidewall spacer of the fine-patterned transistor. Furthermore, in the transistor having the elevated source/drain structure, the sidewall spacer of silicon nitride is used because of the facet formed at the time of the elevated layer formation. In addition, to prevent the semiconductor substrate from being dug at the time of forming the conductor plug connected to the source/drain region, the transistor is covered with a so-called liner film of a silicon nitride film.

Such silicon nitride present around these transistors has higher dielectric constant than silicon oxide and so increases the parasitic capacitance, thus greatly reducing the operating speed of the transistors. Furthermore, trapped charge, distortions, hydrogen, etc. present in the silicon nitride film cause fluctuations in characteristics of the transistors, thus reducing device reliabilities.

BRIEF SUMMARY OF THE INVENTION

According to a first aspect of the present invention, a semiconductor device comprises: a semiconductor substrate; source/drain regions formed in the semiconductor substrate; a gate insulation film formed on the semiconductor substrate; a gate electrode formed on the gate insulation film between the source/drain regions; and a gate sidewall spacer formed on side surfaces of the gate electrode, wherein the gate sidewall spacer is composed of silicon oxide containing 0.1–30 atomic % of chlorine.

According to a second aspect of the present invention, a semiconductor device comprises: a semiconductor substrate; source/drain regions formed in the semiconductor substrate; a gate insulation film formed on the semiconductor substrate; a gate electrode formed on the gate insulation film between the source/drain regions and covered with a gate protecting insulation film; and a gate sidewall spacer formed on side surfaces of the gate electrode, wherein the gate sidewall spacer is composed of silicon oxide containing 0.1–30 atomic % of chlorine.

According to a third aspect of the present invention, a method for manufacturing a semiconductor device comprises forming source/drain regions in a semiconductor substrate; forming a gate insulation film on the semiconductor substrate; forming a gate electrode on the gate insulation film between the source/drain regions; forming an insulation film composed of a silicon nitride film containing chlorine on side surfaces of the gate electrode; and converting the silicon nitride film by oxidation reaction processing into silicon oxide film containing 0.1–30 atomic % of chlorine to provide a gate sidewall spacer.

DETAILED DESCRIPTION OF THE INVENTION

The following will describe embodiments with reference to drawings.

First, a first embodiment is described with reference to FIGS. 1–3.

Figure 1:
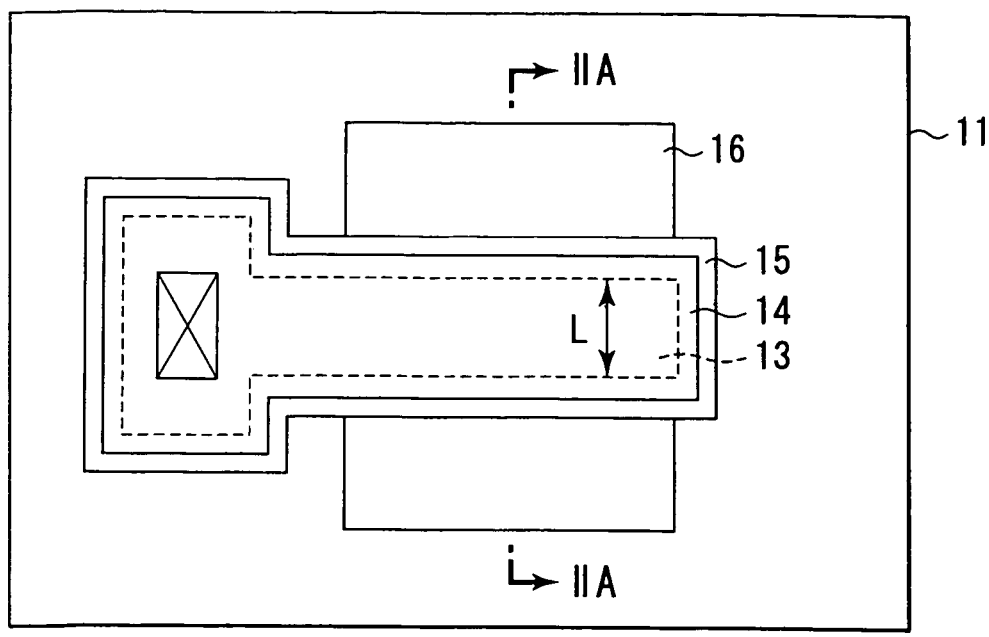
FIG. 1 is a plan view of a transistor according to a first embodiment.
Figure 2A:
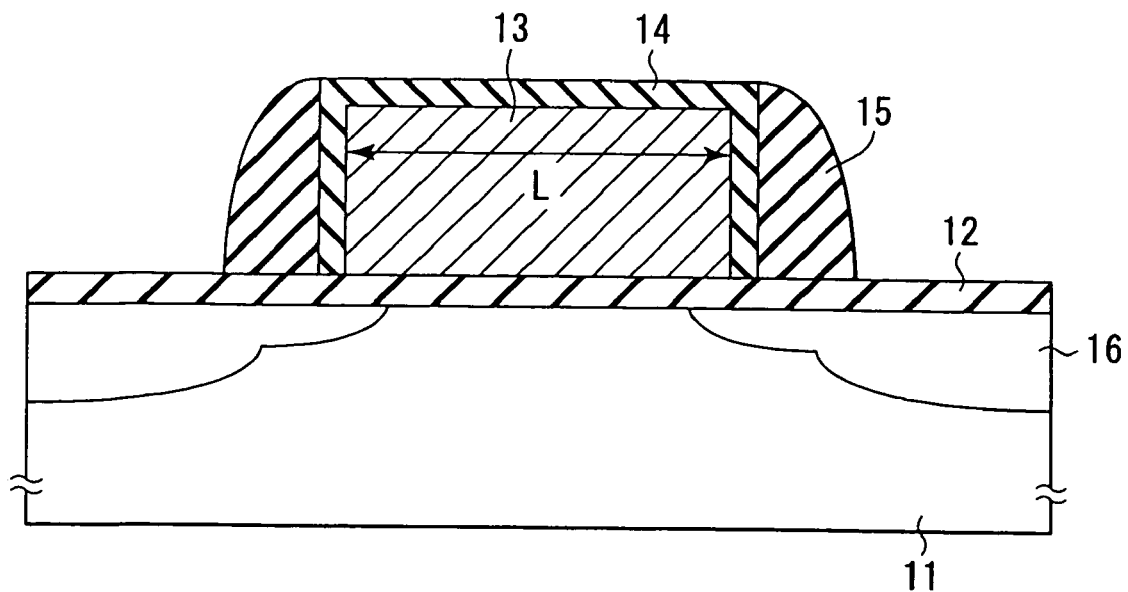
FIGS. 2A and 2B are cross-sectional views of the transistor according to the first embodiment and FIG. 2A is a cross-sectional view taken along line II—II of FIG. 1.
Figure 2B:
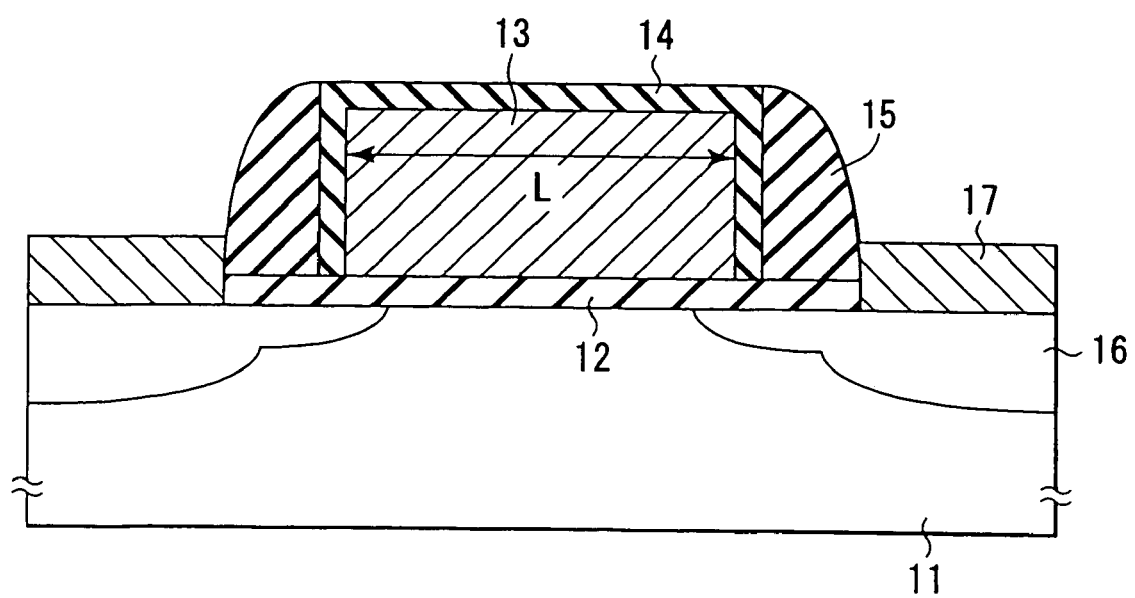

As shown in FIG. 1 and FIGS. 2A–2B, on a semiconductor substrate 11 such as silicon is formed a gate insulation film 12 of a silicon oxide film, on which a gate electrode 13 of polysilicon is provided. Source/drain regions 16 are provided in the semiconductor substrate 11. Side and upper surfaces of the gate electrode 13 are covered with a gate protection insulation film (sidewall oxide layer) 14 of a silicon oxide film, in addition to which, the side surfaces covered with the protection film 14 are further covered with a gate sidewall insulation film (sidewall spacer) 15. A gate length L is for example, 0.2 μm or less. In a MOS transistor having such a structure, the parasitic capacitance occurs between the gate electrode 13 and a source/drain diffusion region 16 (including a wiring layer).

Furthermore, in a semiconductor device having an elevated source/drain construction shown in FIG. 2B, provided on a semiconductor substrate is an elevated source/drain layer 17 made of, for example, mono-crystal silicon which is on the source/drain region. 16 and in contact with the gate sidewall spacer 15. The parasitic capacitance occurs between the gate electrode 13 and the elevated source/drain layer 17 (including the wiring layer) where the gate protection film 14 and the gate sidewall spacer 15 are interposed therebetween.

It is to be noted that the gate sidewall spacer 15 used in the semiconductor device shown in FIGS. 2A–2B is composed of silicon oxide containing chlorine. For example, a silicon oxide film containing chlorine can be formed by plasma CVD using a silicon source gas containing chlorine such as a dichlorosilane ($SiH_2Cl_2$) gas or a tetrachlorosilane ($SiCl_4$) gas and an oxygen source gas such as a dinitrogen monoxide ($N_2O$) gas or $SiO_2$ CVD with a chlorine ($Cl_2$) gas or a hydrogen chloride (HCl) gas as an additional source gas.

Figure 3:
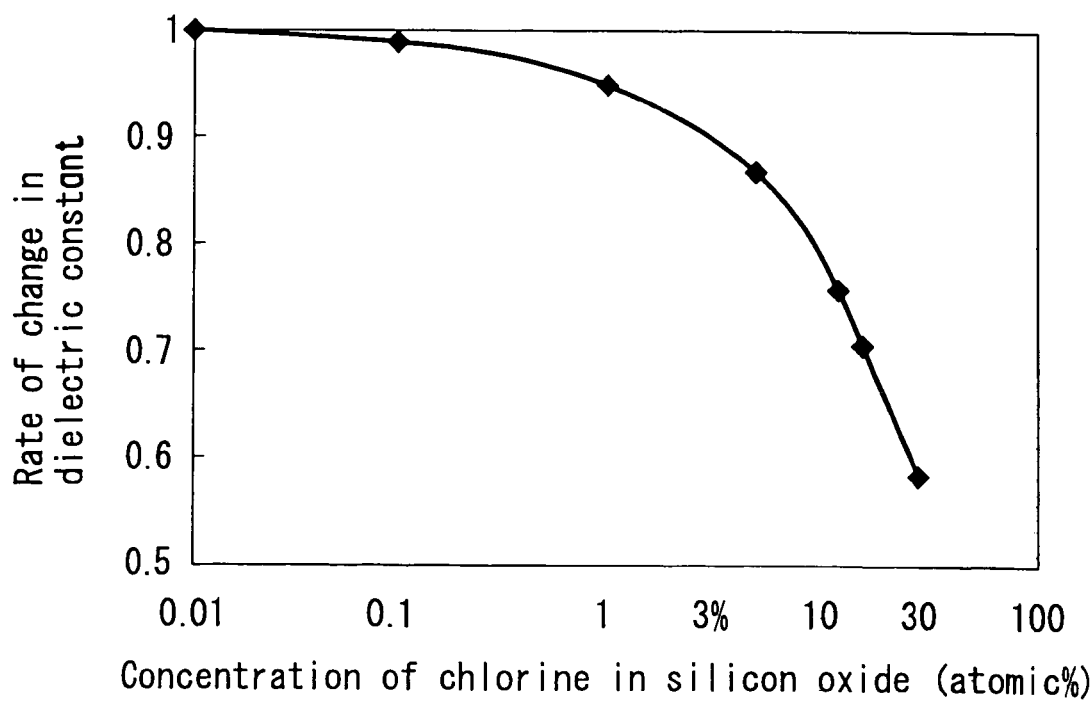
FIG. 3 is a graph for explaining a relationship between a concentration of chlorine in a silicon oxide film and a rate of change in dielectric constant of the silicon oxide film.

FIG. 3 is a graph for explaining dependency of a rate of change in dielectric constant of a silicon oxide film containing chlorine on a chlorine concentration. A vertical axis represents the rate of change in the dielectric constant and a horizontal axis, a concentration of chlorine (atomic %) in the silicon oxide film.

FIG. 3 shows a relationship between the rate of change in the dielectric constant of the silicon oxide film containing chlorine and the chlorine concentration shown in Table 1. If the chlorine concentration of the silicon oxide film containing chlorine is set to 0.1 atomic % or higher, the dielectric constant of this silicon oxide film decreases essentially, thus enabling essentially reducing parasitic capacitance between the gate electrode 13 and the source/drain diffusion region 16 including the wiring layer (not shown) and that between the gate electrode 13 and the elevated source/drain layer 17 (including the wiring layer). It is to be noted that if the chlorine concentration is set to 1 atomic % or more, the parasitic capacitance can be reduced by 5% or more, so that a remarkable advantage will be obtained especially in a fine-patterned transistor having a gate length of 0.2 μm or less.

In such a semiconductor device, the parasitic capacitance can be reduced, so that the thickness of the gate sidewall spacer can be decreased, thus further promoting fine patterning of the elements. Furthermore, by containing chlorine in the silicon oxide film providing the gate protection film which covers an exposed portion of the gate electrode, the parasitic capacitance can be reduced between the gate electrode and the source/drain region or the elevated source/drain layer.

There is no upper limit in principle on the concentration of chlorine contained in the silicon oxide film. If the chlorine concentration increases, however, a hygroscopic property of silicon oxide becomes remarkable, thus rather increasing the dielectric constant in some cases depending on a method of forming elements. It is, therefore, preferable to set the concentration of chlorine in the silicon oxide film to 30 atomic % or less essentially.

Furthermore, to reduce the dielectric constant, fluorine can be introduced into the silicon oxide. Fluorine, however, has an adverse effect such as promotion of diffusion of boron on a fine-patterned transistor, so that it cannot suitably be used in place of chlorine and preferably be used appropriately together with chlorine as occasion demands.

TABLE 1

| Concentration of chlorine in silicon oxide film containing chlorine (atom %) | Rate of change in dielectric constant of silicon oxide film containing chlorine |
| --- | --- |
| 0.01 | 1 |
| 0.1 | 0.99 |
| 1 | 0.95 |
| 5 | 0.87 |
| 13 | 0.76 |
| 16 | 0.71 |
| 30 | 0.59 |

The following will describe a second embodiment with reference to FIGS. 4A–4D and FIGS. 5A–5D.

Figure 4A:
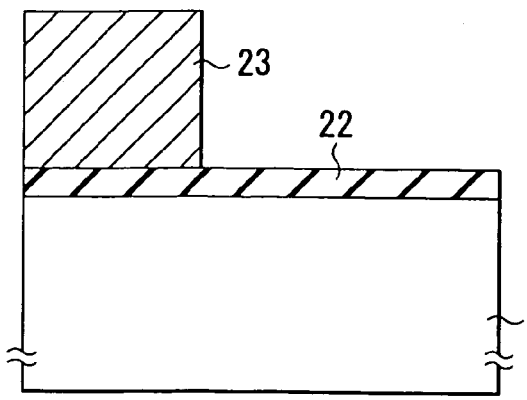
FIGS. 4A to 4D are cross-sectional views for explaining a transistor manufacturing method according to a second embodiment.
Figure 4B:
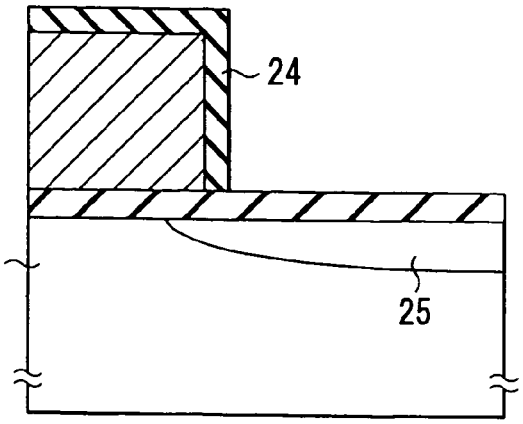
Figure 4C:
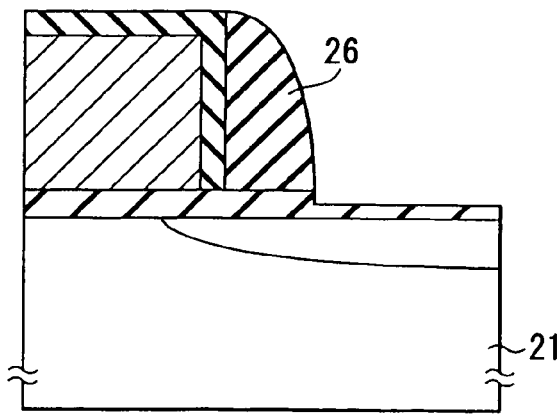

As shown in FIG. 4A, on a surface of a semiconductor substrate 21 such as silicon is formed a gate oxide film 22 by oxidation processing. Then, a polysilicon layer is deposited by CVD and processed by RIE to form a gate electrode 23. Thereafter, as shown in FIG. 4B, an exposed surface of the gate electrode 23 is oxidized to form a gate protection film 24. Then, a part 25 of a source/drain diffusion region is formed in the semiconductor substrate 21 by ion implantation. As shown in FIG. 4C, a silicon nitride film is deposited over the substrate surface by low-pressure CVD using a hexachlorodisilane ($Si_2Cl_6$) gas and an ammonia ($NH_3$) gas. The film forming condition is, for example, a temperature of 400° C., a hexachlorodisilane gas flow rate of 1000 sccm, an ammonia gas flow rate of 10 sccm, and a pressure of 180 Pa. It has been confirmed by secondary-ion mass spectroscopy that this silicon nitride film contains about 10 atomic % of chlorine and hydrogen.

Thereafter, the silicon nitride film is selectively removed by RIE to provide a gate sidewall nitride film 26. In this case, by setting the RIE rate of the gate oxide film 22 lower than that of the gate sidewall nitride film 26, the surface of the semiconductor substrate can be prevented from being roughened.

Figure 4D:
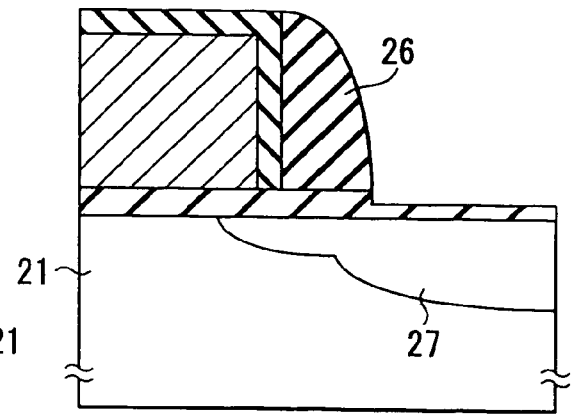

As shown in FIG. 4D, a source/drain diffusion region 27 is formed in the semiconductor substrate 21 by ion implantation. In this case, since the surface of the semiconductor substrate is prevented from being roughened, it is possible to suppress the shape of the diffusion region from being varied from one another. This results in elimination of fluctuations in operating characteristics of the elements.

Figure 5A:
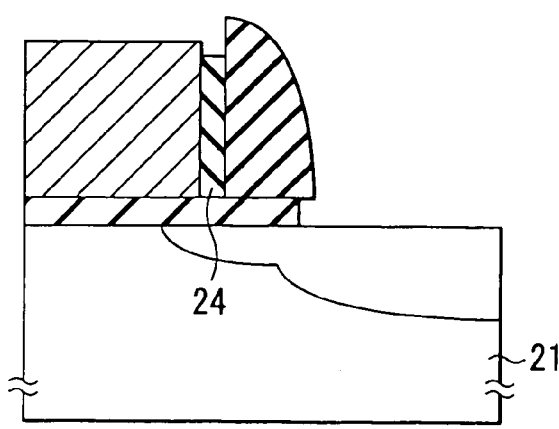
FIGS. 5A to 5D are cross-sectional views for explaining the transistor manufacturing method according to the second embodiment.

Next, as shown in FIG. 5A, the gate oxide film is removed from both the upper surface of the gate electrode 23 and the surface of the source/drain region 27 using dilute hydrofluoric acid. In this case, since the silicon nitride film is not almost etched, the gate sidewall spacer 26 remains in a desired shape on all of the elements.

Figure 5B:
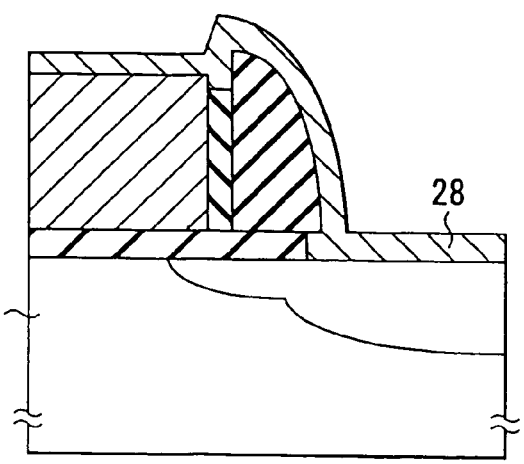
Figure 5C:
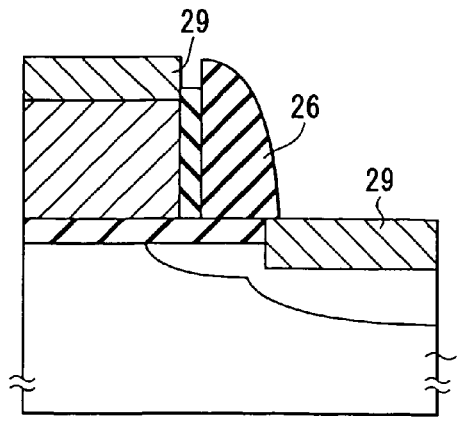

As shown in FIG. 5B, a cobalt layer 28 is deposited over the substrate surface by sputtering. Then, as shown in FIG. 5C, a cobalt silicide layer 29 is formed by the lamp heating on the upper surface of the gate electrode 23 and the surface of the source/drain region 27.

Thereafter, a non-reacted portion of the cobalt layer is removed. In this case, since the gate sidewall spacer 26 is formed already, the gate electrode 23 and the source/drain diffusion region 27 do not electrically connected to each other, thereby essentially avoiding a problem of a decrease in yield.

Figure 5D:
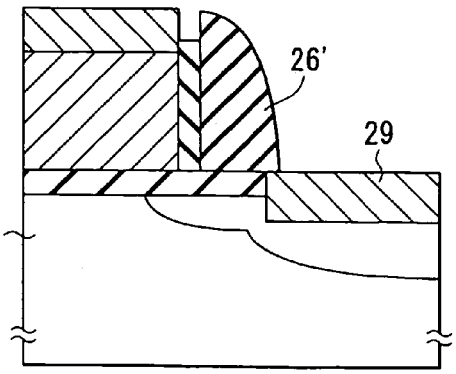

As shown in FIG. 5D, the gate sidewall spacer 26 of the nitride film can be annealed in a water vapor atmosphere to be converted into a silicon oxide film containing chlorine, which is provided as the gate sidewall insulation film 26'. The annealing condition is given by, for example, a temperature of 150° C. and a pressure of 2 atmospheres. It has been confirmed by secondary-ion mass spectroscopy that this silicon oxide film contains of the order of 1 atomic % of chlorine and hydrogen.

Thereafter, an interlevel insulation film, a wiring layer, etc. are formed on the semiconductor substrate by a known method, thus completing the MOS transistor. In this case, since the nitride film of the gate sidewall spacer is converted into the silicon oxide film already, the parasitic capacitance is reduced between the gate electrode 23 and the source/drain diffusion region 27 including the wiring layer, thus avoiding a decrease in operating speed of the elements.

In the above-described processing, the silicon nitride film is converted into the silicon oxide film with annealing in the water vapor atmosphere. However, an oxidizing atmosphere of oxygen, ozone, etc., or an atmosphere of a mixture may be also used. A water vapor atmosphere, however, is suitable because the silicon nitride film is converted into the silicon oxide film even at a low temperature. Furthermore, annealing may be conducted at a pressure of 1 atmosphere or less but preferably be conducted at a pressure higher than 1 atmosphere.

The following will describe a third embodiment with reference to FIGS. 6A–6D.

In description of the present embodiment, steps are explained for manufacturing a transistor having an elevated source/drain structure.

Figure 6A:
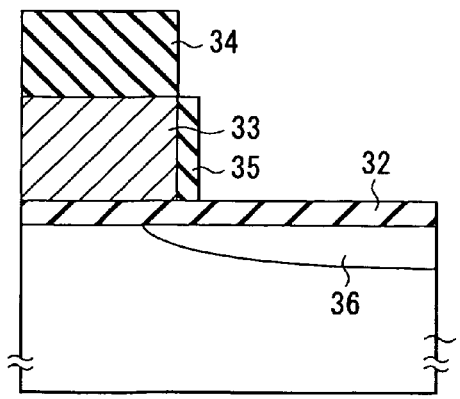
FIGS. 6A to 6D are cross-sectional views for explaining a transistor manufacturing method according to a third embodiment.

First, as shown in FIG. 6A, on a semiconductor substrate 31 such as silicon is formed a gate insulation film 32 such as a silicon oxide film. Then, a polysilicon layer and a silicon nitride film 34 which serves as a mask for RIE processing are deposited by CVD consecutively, and the polysilicon is processed by RIE to form a gate electrode 33. Subsequently, an exposed surface of the gate electrode 33 is oxidized to form a gate protecting insulation film 35. Then, a part 36 of a source/drain diffusion region is formed in the semiconductor substrate 31 by ion implantation.

Figure 6B:
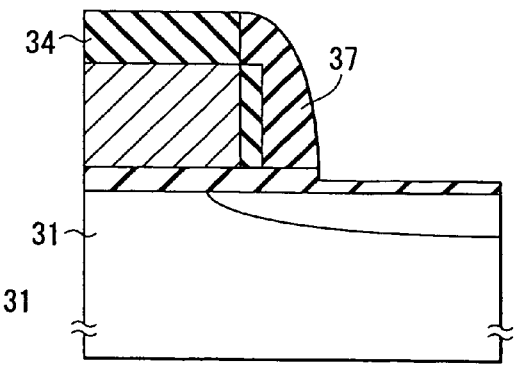

As shown in FIG. 6B, a silicon nitride film is deposited over the substrate surface by low-pressure CVD using a hexachlorodisilane ($Si_2Cl_6$) gas and an ammonia ($NH_3$) gas. A film forming condition is given by, for example, a temperature of 400° C., a hexachlorodisilane gas flow rate of 1000 sccm, an ammonia gas flow rate of 10 sccm, and a pressure of 180 Pa. Then, the silicon nitride film is removed by RIE to provide a gate sidewall nitride film 37. In this case, by setting the RIE rate of the gate oxide film 32 lower than that of the gate sidewall nitride film 37, the surface of the semiconductor substrate 31 is prevented from being roughened.

Figure 6C:
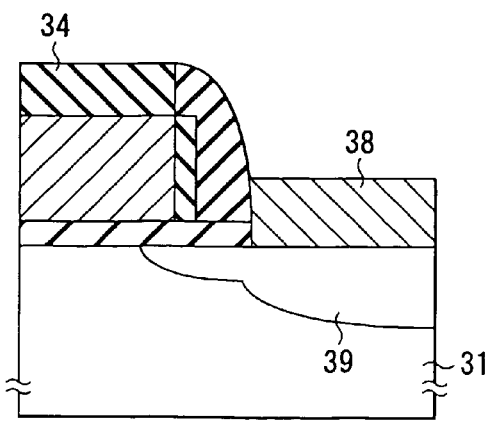

As shown in FIG. 6C, an elevated source/drain layer 38 is formed by epitaxial growth of silicon. The forming condition is given by, for example, a temperature of 600° C., a dichlorosilane ($SiH_2Cl_2$) gas flow rate of 300 sccm, a germane ($GeH_4$) gas flow rate of 10 sccm, an hydrogen chloride gas flow rate of 100 sccm, a hydrogen gas flow rate of 1500 sccm, and a pressure of 2 kPa. In this case, since the sidewall spacer 37 is adjoined, a gap called the facet is not formed. The reason for use of the germane gas is to lower the forming temperature when the elevated layer 38 is produced. If the elevated layer is formed at a high temperature, the silicon nitride film is densified and cannot be easily converted into the silicon oxide film later. A source/drain diffusion region 39 is formed in the silicon substrate by ion implantation. In this case, the unwanted facet is prevented from being formed, so that it is possible to suppress the variation in the shape of the diffusion regions. Therefore, the threshold values of the transistors can be controlled easily.

Figure 6D:
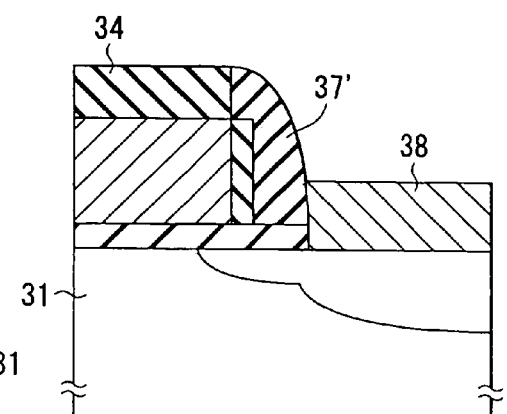
Figure 7A:
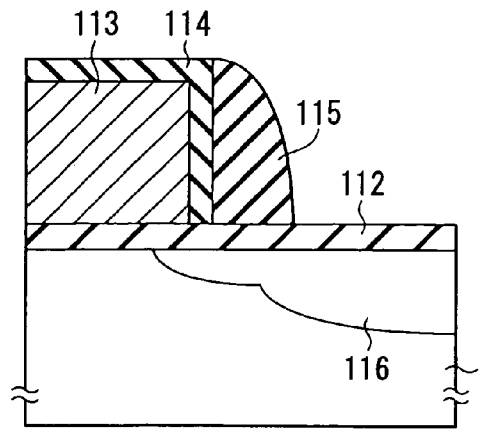
FIGS. 7A to 7B are cross-sectional views for explaining a conventional transistor manufacturing method.
Figure 7B:
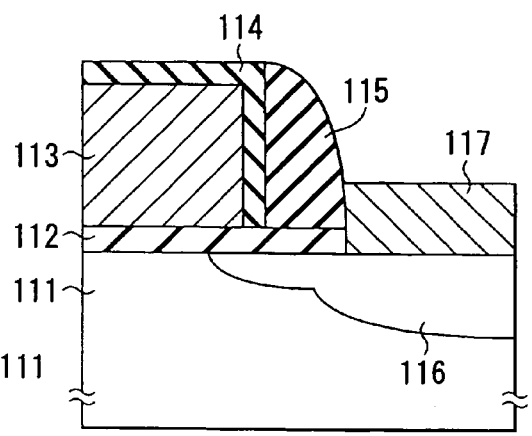
Figure 8A:
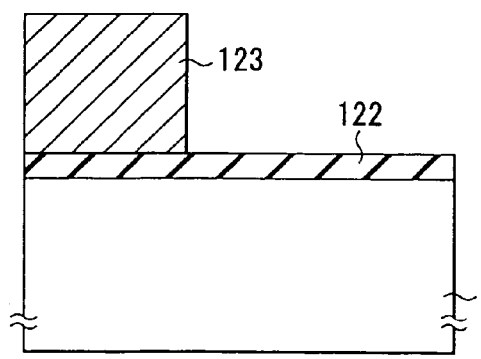
FIGS. 8A to 8D are cross-sectional views for explaining the conventional transistor manufacturing method.
Figure 8B:
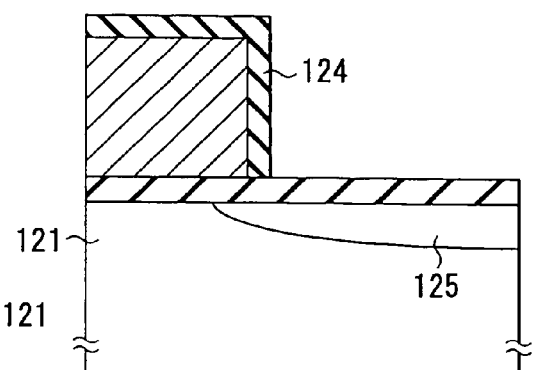
Figure 8C:
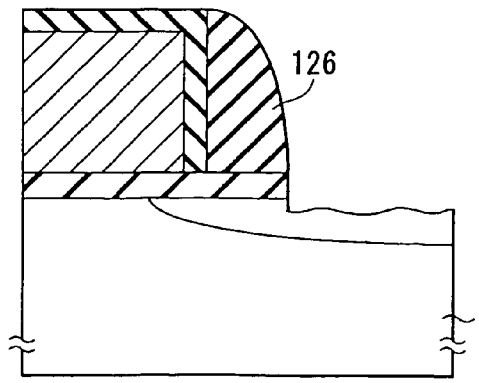
Figure 8D:
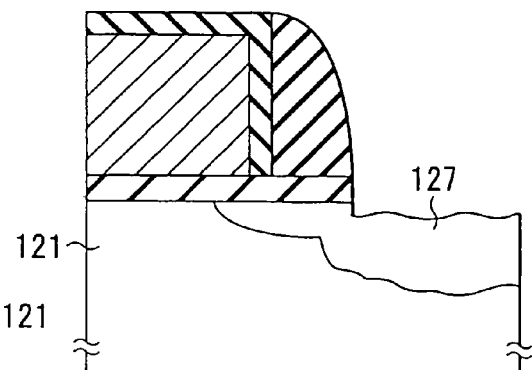
Figure 9A:
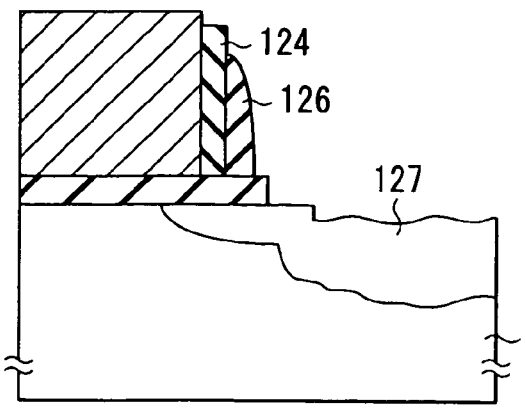
FIGS. 9A to 9C are cross-sectional views for explaining the conventional transistor manufacturing method.
Figure 9B:
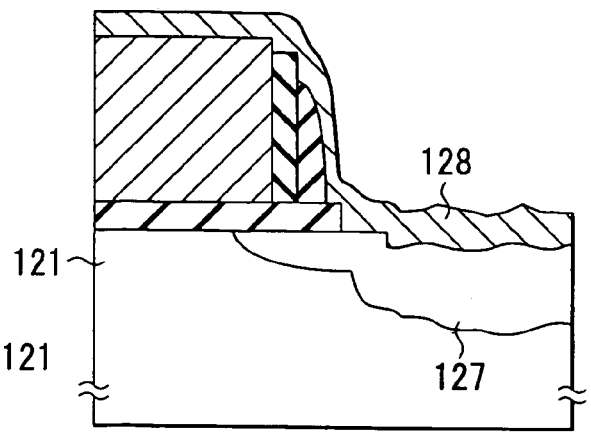
Figure 9C:
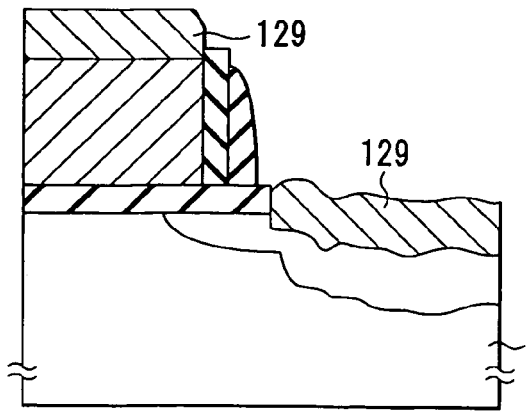
Figure 10A:
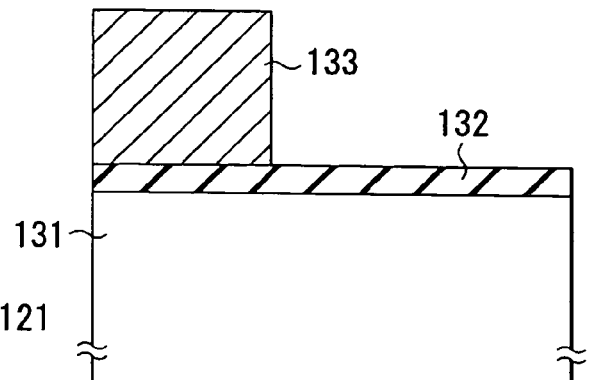
FIGS. 10A to 10D are cross-sectional views for explaining the conventional transistor manufacturing method.
Figure 10B:
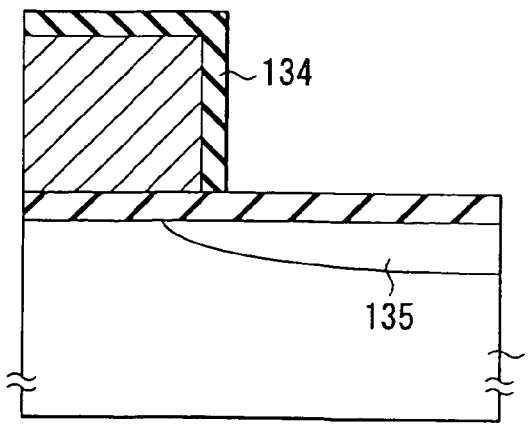
Figure 10C:
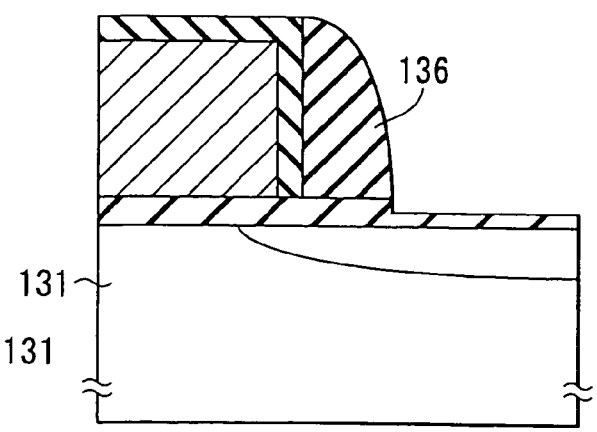
Figure 10D:
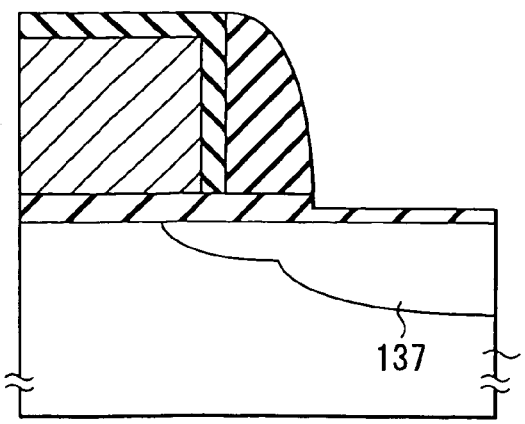
Figure 11A:
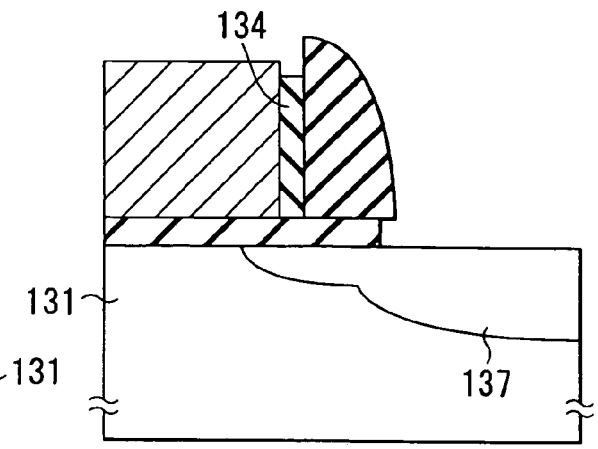
FIGS. 11A to 11C are cross-sectional views for explaining the conventional transistor manufacturing method.
Figure 11B:
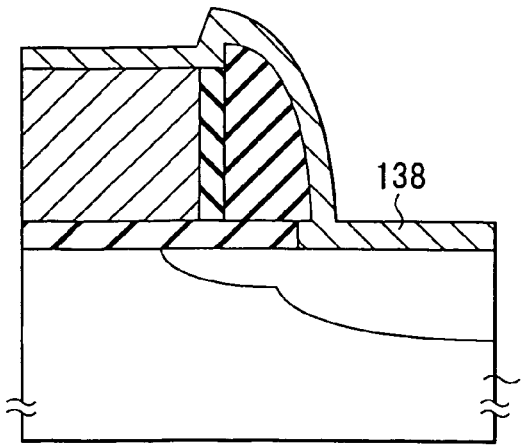
Figure 11C:
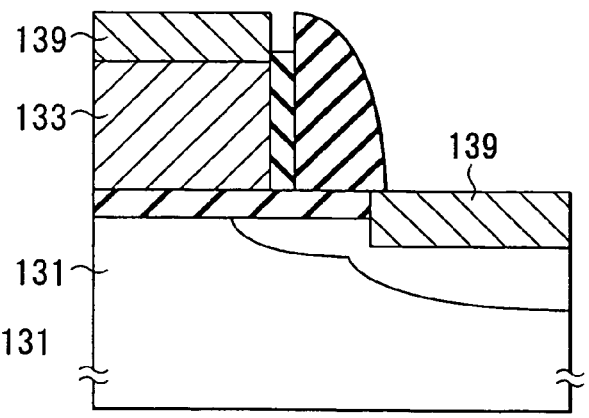
Figure 12A:
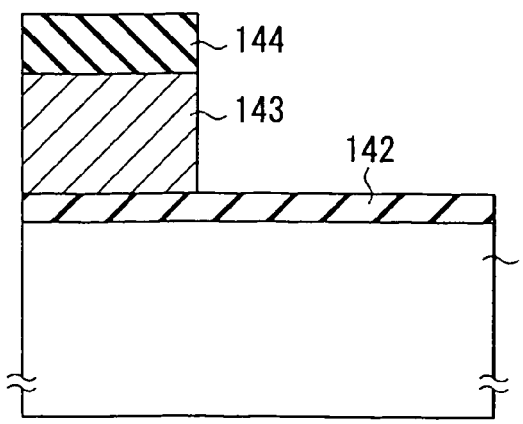
FIGS. 12A to 12D are cross-sectional views for explaining the conventional transistor manufacturing method.
Figure 12B:
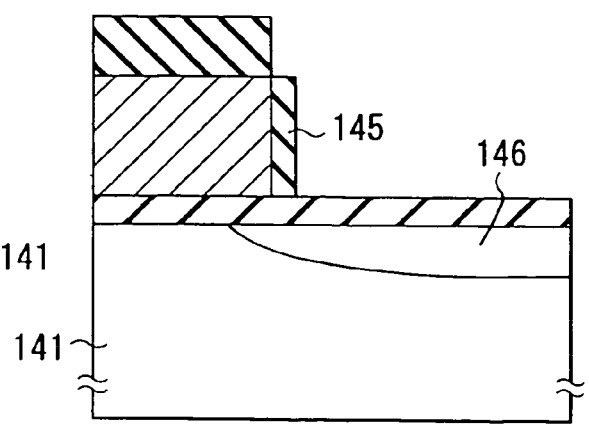
Figure 12C:
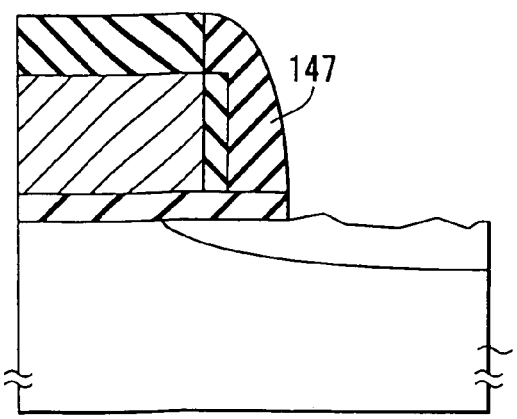
Figure 12D:
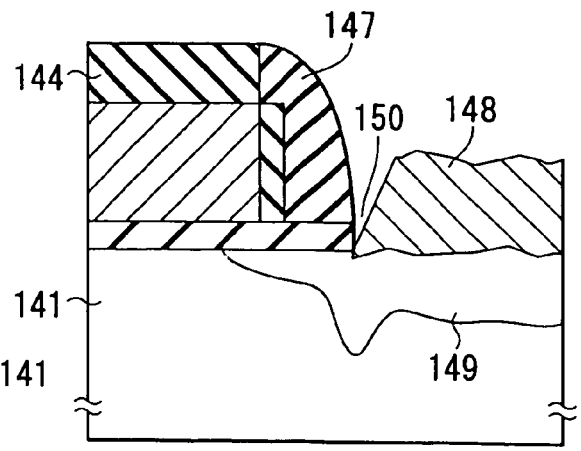
Figure 13A:
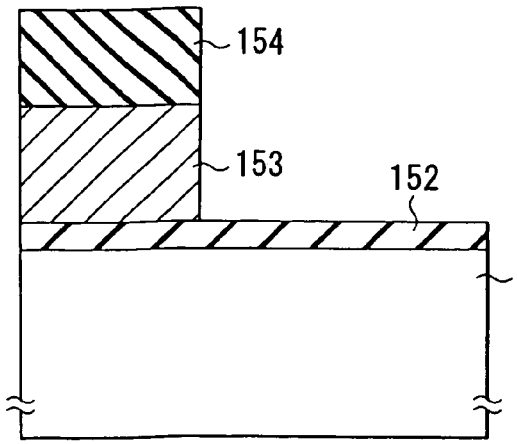
FIGS. 13A to 13D are cross-sectional views for explaining the conventional transistor manufacturing method.
Figure 13B:
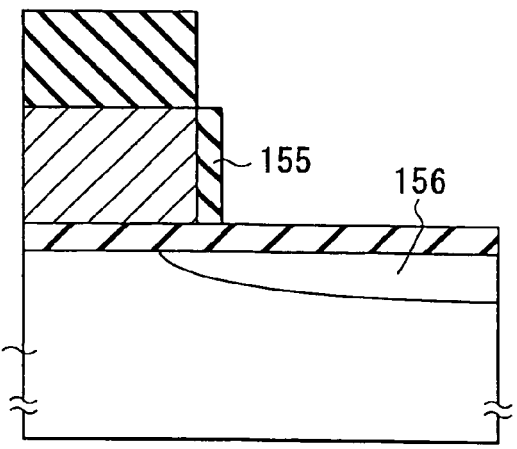
Figure 13C:
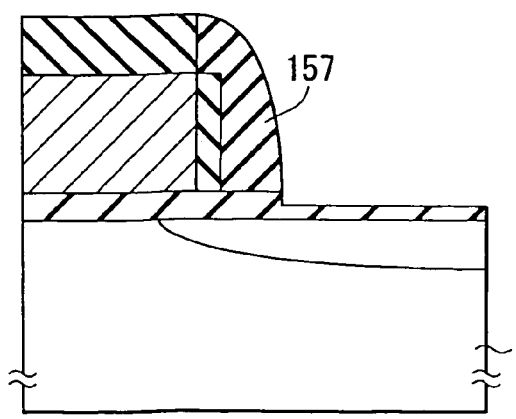
Figure 13D:
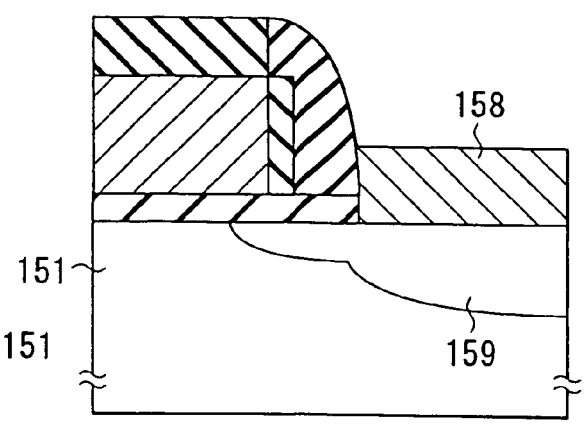

As shown in FIG. 6D, by annealing the sidewall nitride film 37 in a water vapor atmosphere, it is converted into the silicon oxide film containing. chlorine, thereby providing the gate sidewall spacer 37'. The annealing condition is given by, for example, a temperature of 400° C. and a pressure of 1 atmosphere. It has been confirmed by secondary-ion mass spectroscopy that this silicon oxide film contains about 0.1 atom % of chlorine and hydrogen.

Thereafter, an interlevel insulation film, a wiring layer, etc. are provided on the semiconductor substrate by a known method, thus completing the MOS transistor.

In this case, since the gate sidewall insulation film is converted into the silicon oxide film already, parasitic capacitance is reduced between the gate electrode 33 and the source/drain diffusion region 38 including the wiring layer, thus avoiding a decrease in operating speed of the elements.

Besides the above-mentioned embodiments, it is possible to convert a silicon nitride film, which is present around a transistor, into a silicon oxide film after the element is completed. Once it is converted into an oxide, it is possible to prevent a decrease in operating speed of the transistor, reliability of the device, etc. owing to the silicon nitride film having a high dielectric constant.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A method for manufacturing a semiconductor device comprising:
   forming source/drain regions in a semiconductor substrate;
   forming a gate insulation film on the substrate;
   forming a gate electrode on the gate insulation film between the source / drain regions;
   forming an insulation film composed of a silicon nitride film containing chlorine at side surfaces of the gate electrode; and
   converting the silicon nitride film by oxidation reaction processing into a silicon oxide film containing 0.1–30 atomic % of chlorine to provide a gate sidewall spacer.

2. The method according to claim 1, wherein entire region of the silicon nitride film is converted into the silicon oxide film containing chlorine by the oxidation reaction.

3. The method according to claim 1, wherein the insulation film is produced using a hexachlorodisilane gas and an ammonia gas.

4. The method according to claim 1, wherein the silicon nitride film is converted into the silicon oxide film containing 1 atomic % or more of chlorine, and the semiconductor device has a gate length of 0.2 µm or less.

5. A method for manufacturing a semiconductor device comprising:
   forming a gate insulation film over a semiconductor substrate;
   forming a gate electrode on a part of the gate insulation film;
   forming an insulation film composed of a silicon nitride film containing chlorine at side surfaces of the gate electrode;
   forming source/drain regions in the substrate;
   removing the gate insulation film from a surface of the substrate using the silicon nitride film as a mask to expose the substrate surface; and
   converting the silicon nitride film by oxidation reaction processing into a silicon oxide film containing 0.1–30 atomic % of chlorine to provide a gate sidewall spacer.

6. The method according to claim 5, wherein a suicide layer is formed on the exposed substrate surface.

7. The method according to claim 6, further comprising forming an insulation film on the gate electrode, wherein:
   the gate insulation film on the substrate and the insulation film on the gate electrode are removed during exposing the substrate surface; and
   a silicide layer is produced on both the substrate surface and the gate electrode during forming the silicide layer.

8. The method according to claim 5, wherein a silicon layer is epitaxially grown on the exposed substrate surface.

9. The method according to claim 8, wherein the source/drain regions are formed in the substrate and the silicon layer, respectively, after epitaxially growing the silicon layer.

10. The method according to claim 5, wherein the oxidation reaction processing is accomplished after the silicon layer is produced.

11. The method according to claim 5, wherein entire region of the silicon nitride film is converted into the silicon oxide film containing chlorine by the oxidation reaction.

12. The method according to claim 5, wherein the insulation film composed of the silicon nitride film containing chlorine is produced, using a hexachlorodisilane gas and an ammonia gas.

13. The method according to claim 5, wherein the silicon nitride film is converted into the silicon oxide film containing 1 atomic % or more of chlorine, and the semiconductor device has a gate length of 0.2 µm or less.

14. The method according to claim 5, wherein the conversion into the silicon oxide film is accomplished by the oxidization reaction using water vapor as a main oxidation agent.

15. The method according to claim 5, wherein the conversion into the silicon oxide film is accomplished by the oxidization reaction under a pressure in excess of atmospheric pressure.

* * * * *

UNITED STATES PATENT AND TRADEMARK OFFICE
CERTIFICATE OF CORRECTION

PATENT NO. : 7,148,158 B2 Page 1 of 1
APPLICATION NO. : 10/916500
DATED : December 12, 2006
INVENTOR(S) : Ozawa et al.

It is certified that error appears in the above-identified patent and that said Letters Patent is hereby corrected as shown below:

Column 10, line 4, change "suicide" to --silicide--.

Signed and Sealed this

Sixth Day of March, 2007

JON W. DUDAS
*Director of the United States Patent and Trademark Office*